(12) United States Patent
Bailey et al.

(10) Patent No.: US 7,135,915 B2
(45) Date of Patent: Nov. 14, 2006

(54) TUNING FILTERS HAVING TRANSCONDUCTOR CELLS

(75) Inventors: James A. Bailey, Snowflake, AZ (US); Robert Kuo-Wei Chen, North Andover, MA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/755,937

(22) Filed: Jan. 13, 2004

(65) Prior Publication Data
US 2005/0151582 A1    Jul. 14, 2005

(51) Int. Cl.
*H03K 5/00*    (2006.01)
(52) U.S. Cl. .................................. 327/553; 327/552
(58) Field of Classification Search ......... 327/552–559
See application file for complete search history.

(56) References Cited

U.S. PATENT DOCUMENTS 5,625,317 A *  4/1997  Deveirman ................. 327/553
5,729,230 A *  3/1998  Jensen et al. ............... 341/143

OTHER PUBLICATIONS

"A 1.92GHz Image-Reject Front-End with Automatic Tuning in a 0.15μm CMOS Technology", by Mustafa H. Koroglu et al., Sep. 2003, 2003 IEEE International Solid-State Circuits Conference, Paper 15.2, 10 pages.
"Integrated Continuous-Time Filters" Principles, Design, and Applications, by Y.P. Tsividis and J.O. Voorman, Reprint vol. IEEE Circuits and Systems Society, New York, 1993, pp. 282-283.

* cited by examiner

*Primary Examiner*—Dinh T. Le

(57) ABSTRACT

In one embodiment, a filter with a main signal path having one or more biquadratic filter sections is tuned using a tuning circuit based on a biquadratic filter that can be configured to oscillate at the filter's cutoff frequency. In one application, a tuning circuit outside of the main signal path is used to tune each biquadratic filter section of the main signal path. In another application, each filter section along the main signal path has a biquadratic filter that can oscillate and corresponding tuning elements that enable the filter section to tune itself. According to certain embodiments of the present invention, a biquadratic filter is made to oscillate by applying a common-mode voltage signal to the inputs of the filter's third transconductor cell to make the cell's transconductance go to zero. The invention may also be implemented in the context of filters having ladder structures in their main signal path.

27 Claims, 5 Drawing Sheets

TUNING FILTERS HAVING TRANSCONDUCTOR CELLS

BACKGROUND OF THE INVENTION

1. Field of the Invention

The present invention relates to electrical signal processing, and, in particular, to continuous-time filters implemented with transconductor cells, such as filters having one or more biquadratic filter sections and filters having ladder structures.

2. Description of the Related Art

FIG. 1 shows a block diagram of a prior-art filter 100 used to generate a filtered electrical output signal 106 from an electrical input signal 102. Filter 100 has two biquadratic filter sections 104a and 104b and a tuning circuit 108. Filter section 104a receives and filters input signal 102. Filter section 104b receives and further filters the signal generated by filter section 104a to generate output signal 106. Tuning circuit 108 provides control signals 110 that control the tuning of filter sections 104a–b.

FIG. 2 shows a block diagram of the architecture of each biquadratic filter section 104 of FIG. 1. As shown in FIG. 2, each biquadratic filter section 104 has four transconductor (gm) cells 202a–d (having transconductances $g_{m1}$, $g_{m2}$, $-g_{m3}$, and $-g_{m4}$, respectively) and two capacitors C1 and C2. The filter section's input signal Vin is received at the input to gm cell 202a, while the filter section's output signal Vout is presented at the node shared by gm cells 202b and 202d and capacitor C2. The biquadratic filter section of FIG. 2 may be said to have an input node 204 (to which gm cell 202a is connected), an intermediate node 206 (to which capacitor C1 and all four gm cells are connected), and an output node 208 (to which capacitor C2 and gm cells 202b and 202d are connected).

Each biquadratic filter section 104 in FIG. 1 implements a pair of corresponding complex poles located in the complex plane at A±Bj, where the Q of the filter section is given by $\sqrt{A^2+B^2}/2A$.

FIG. 3 shows a schematic circuit diagram of the architecture of the main components of each transconductor cell 202 of FIG. 2. As shown in FIG. 2, the cell's differential input signal Vin+, Vin− is respectively applied to the gates of transistors M1 and M2. The outputs from current sources I1 and I2 are applied to the drains of M1 and M2, respectively, while the sources of M1 and M2 are both connected to the input of current sink I3. The cell's differential output signal Vout+, Vout−appears at the drains of M1 and M2. Common-mode control circuit 302 samples the differential output signal and generates a control signal 304 for current sink I3, e.g., to maintain a desired common-mode voltage level at Vout+ and Vout−.

Referring again to FIG. 1, tuning circuit 108 of filter 100 has an oscillator 112 consisting of two integrators 114a and 114b configured in a loop, where each integrator 114 has a transconductor cell 116 and a capacitor 118. In addition, tuning circuit 108 has a reference oscillator 120, a phase detector 122, and a charge pump/filter 124. Phase detector 122 compares the reference oscillator's output signal 126 to a signal 128 based on the signal oscillating within oscillator 112 to generate UP or DOWN control signals for charge pump/filter 124, depending on whether the phase of oscillation signal 128 lags or leads the phase of reference signal 126. Charge pump/filter 124 accumulates electrical charge corresponding to the UP/DOWN signals from phase detector 122 to generate a tuning control signal 130 used to control the tuning of gm cells 116a–b to drive the oscillation frequency of oscillator 112 to match that of reference oscillator 120. As such, tuning circuit 108 functions as a phase-locked loop (PLL).

The electrical characteristics of transconductor cells 116a–b and capacitors 118a–b are specifically selected to replicate as closely as possible the electrical characteristics of each biquadratic filter section 104 in the main signal path of filter 100. As such, the same control signal (130) used to control the tuning of gm cells 116a–b in oscillator 112 is also applied as control signals 110 to control the tuning of gm cells in each biquadratic filter section 104 (as indicated in both FIGS. 1 and 2).

Although not shown in the figures, an amplitude detector is often employed within tuning circuit 108 to monitor the amplitude of the signal oscillating within oscillator 112 to adjust the output conductance of each gm cell in order to maintain a constant, desired oscillator amplitude. This can provide accurate tuning of the Q of each biquadratic filter section 104 in filter 100.

Notwithstanding the general operability of filter 100, errors will typically result from a number of sources, including differences in parasitic capacitances at the transconductor cell output nodes, random component mismatch, and differences in cell loading. In addition, the reference oscillator in the tuning circuit can create interference with the signal being filtered in the main signal path.

SUMMARY OF THE INVENTION

Problems in the prior art are addressed in accordance with the principles of the present invention by providing, in one exemplary embodiment, circuitry comprising a filter having one or more filter sections, wherein at least one of the one or more filter sections comprises a plurality of transconductor (gm) cells. At least one of the gm cells can be configured to have substantially zero transconductance, such that the at least one filter section will oscillate.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

The appearances of the phrase "in one embodiment" in various places in the specification are not necessarily all referring to the same embodiment, nor are separate or alternative embodiments necessarily mutually exclusive of other embodiments.

Preferred embodiments of the present invention employ a technique for tuning filters implemented with transconductor cells, such as filters having biquadratic filter sections and filters having ladder structures. According to one embodiment of this technique, a biquadratic filter section is designed to support both a filter mode (in which the section functions as a conventional filter) and a tuning mode (in which the section oscillates and can be tuned to achieve a desired cutoff frequency). In one application, a biquadratic filter section of the present invention is configured to operate as the tuning circuit for a filter having a main signal path with one or more instances of analogous biquadratic filter sections. In another application, each filter section in the main signal path of a filter is implemented using an instance of a biquadratic filter section of the present invention including tuning circuitry that enables each filter section to tune itself. The present invention can also be implemented in the context of other types of filters implemented using transconductor cells, such as filters with ladder structures.

Figure 1:
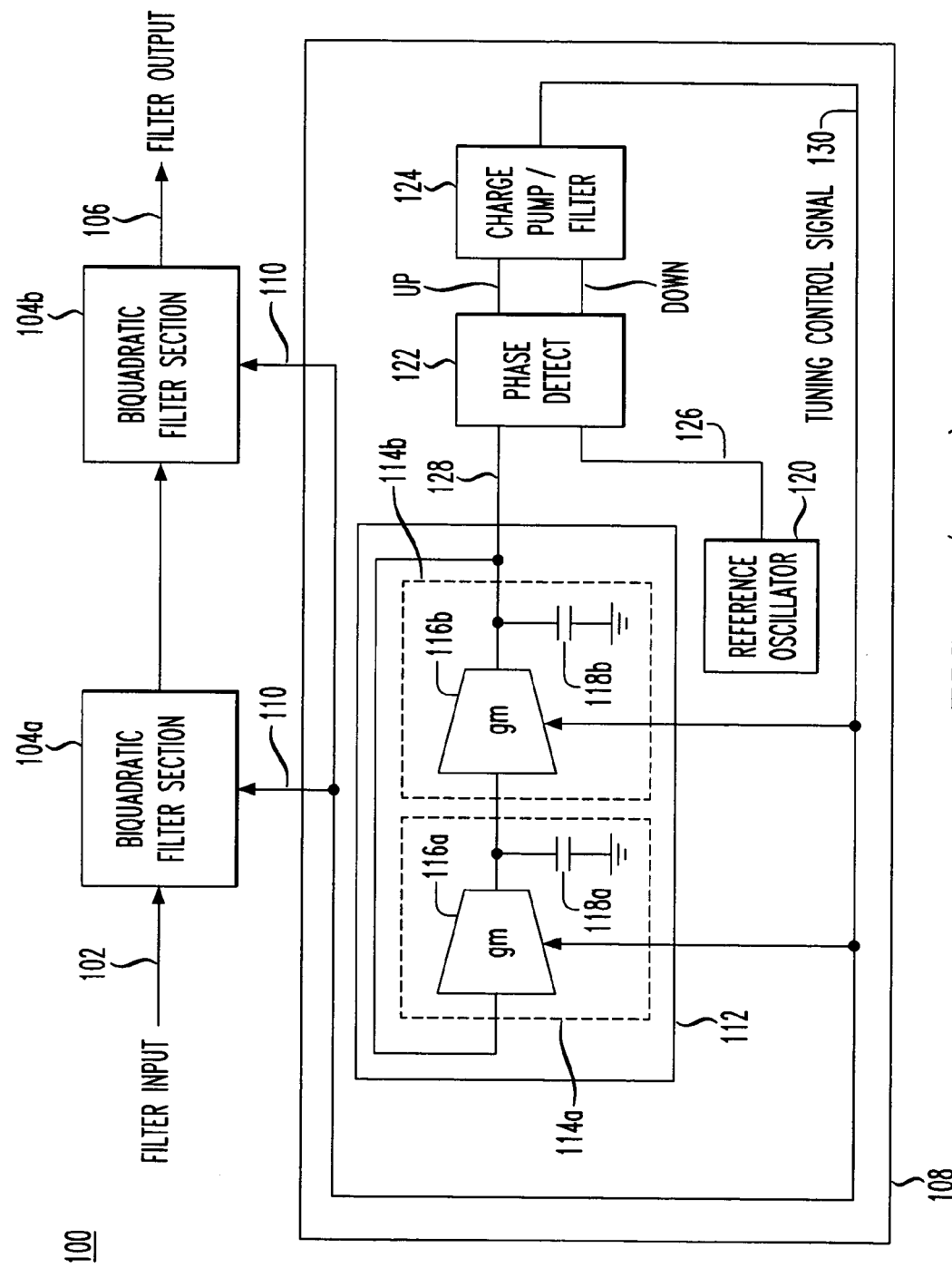
FIG. 1 shows a block diagram of a prior-art filter having two biquadratic filter sections.

The present invention can provide filters having lower power dissipation, more accurate tuning, and reduced interference as compared with prior-art filters, such as those based on the architecture of FIG. 1.

Exemplary Filters Having Biquadratic Filter Sections

Figure 4:
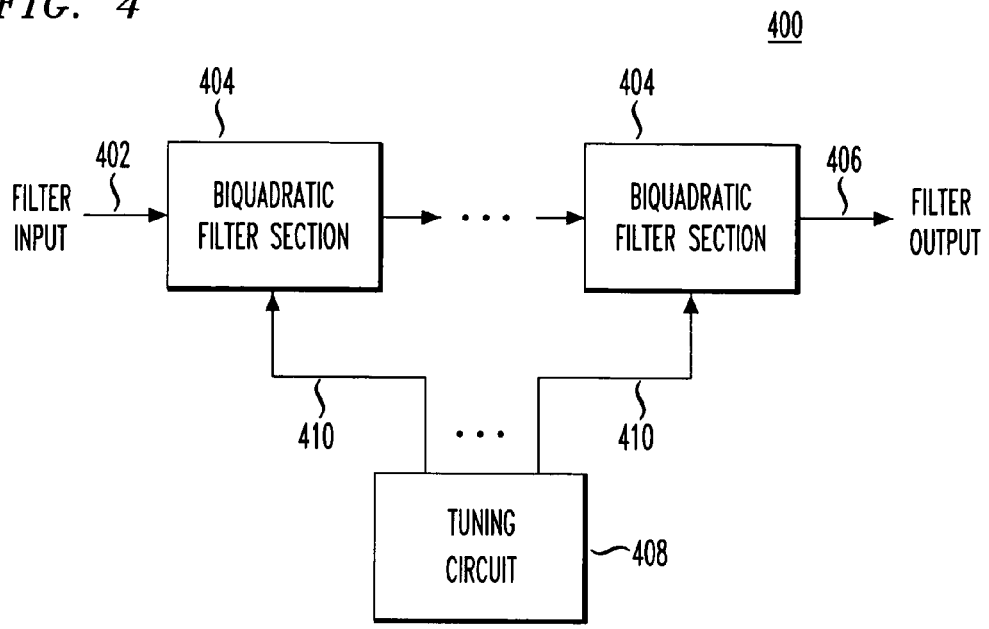
FIG. 4 shows a block diagram of a filter having biquadratic filter sections, according to one embodiment of the present invention.

FIG. 4 shows a block diagram of a filter 400, according to one embodiment of the present invention. Filter 400 has a main signal path comprising one or more biquadratic filter sections 404, where the main signal path receives an input signal 402 and generates the filtered output signal 406, where the output from each biquadratic filter section provides the input to the next biquadratic filter section along the main signal path. Each biquadratic filter section 404 has the same general architecture as that shown in FIG. 2. Filter 400 also has a tuning circuit 408, which provides tuning signals 410 to each biquadratic filter section 404 along the main signal path.

Figure 5:
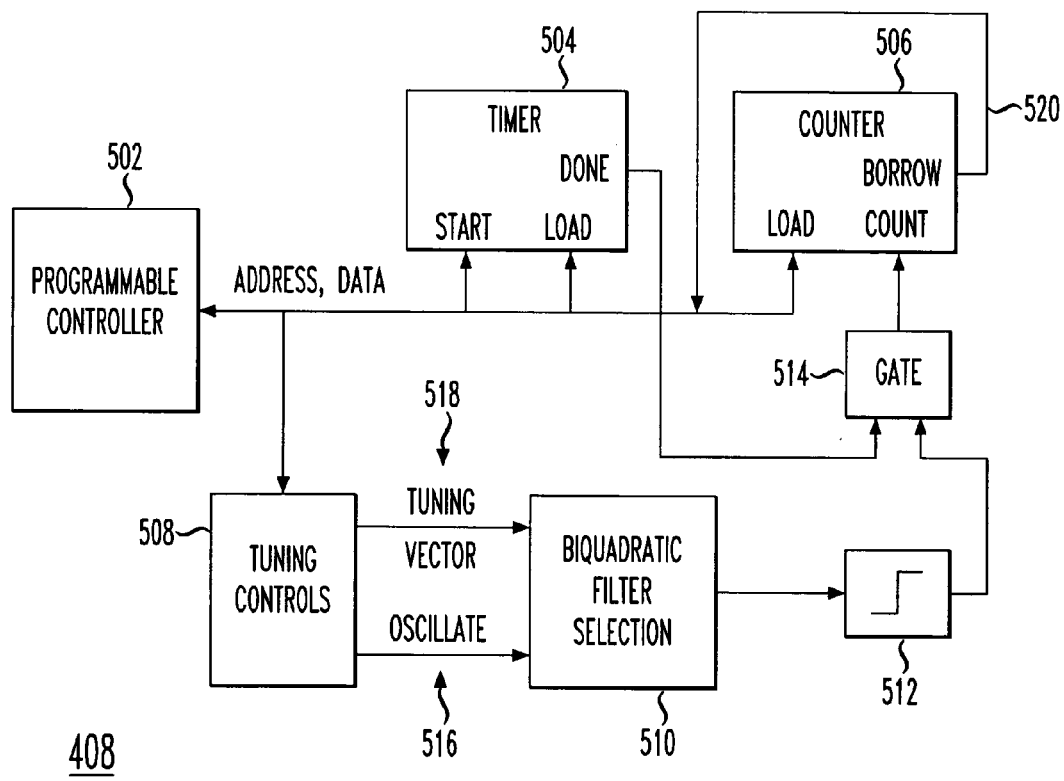
FIG. 5 shows a block diagram of the tuning circuit of FIG. 4.

FIG. 5 shows a block diagram of tuning circuit 408 of FIG. 4. As shown in FIG. 5, tuning circuit 408 has, among other elements to be discussed later on, a biquadratic filter section 510, which also has the same general architecture as that shown in FIG. 2. In addition, with the sole exception of the third transconductor cell of biquadratic filter section 510 of tuning circuit 408 (corresponding to gm cell 202c of FIG. 2), each transconductor cell of each biquadratic filter section (i.e., section 510 of FIG. 5 and sections 404 of FIG. 4) in filter 400 has the same general architecture as that shown in FIG. 3.

Figure 6:
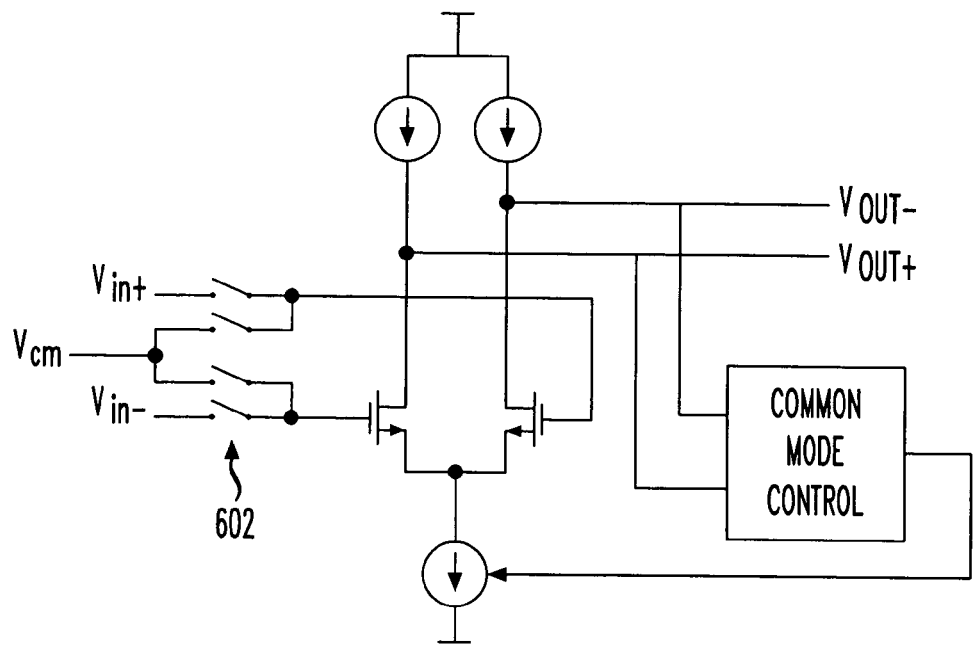
FIG. 6 shows a schematic circuit diagram of the architecture of the main components of the third transconductor cell of the biquadratic filter section of the tuning circuit of FIG. 4.

FIG. 6 shows a schematic circuit diagram of the architecture of the main components of the third transconductor cell of biquadratic filter section 510 of tuning circuit 408 of FIGS. 4 and 5. In addition to all of the elements shown in FIG. 3, this third gm cell has a set of switches 602 that can be selectively configured to apply either (a) the differential input signal Vin+, Vin- to the two gm cell inputs, respectively, or (b) the common-mode voltage signal Vcm to both gm cell inputs. When the differential input signal Vin+, Vin- is selected, the third transconductor cell operates in the same (i.e., filter mode) manner as the other third transconductor cells of the other biquadratic filter sections (i.e., sections 404). However, when the common-mode voltage signal Vcm is selected, biquadratic filter section 510 of tuning circuit 408 will oscillate at a frequency corresponding to the filter section's cutoff frequency when the filter section is operated in its filter mode.

Figure 2:
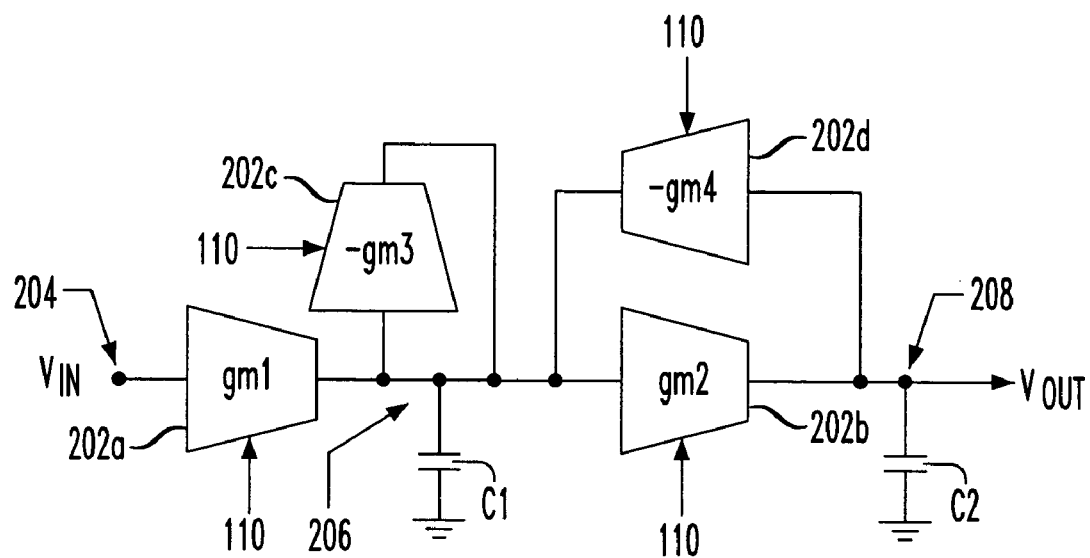
FIG. 2 shows a block diagram of the architecture of each biquadratic filter section of FIG. 1.
Figure 3:
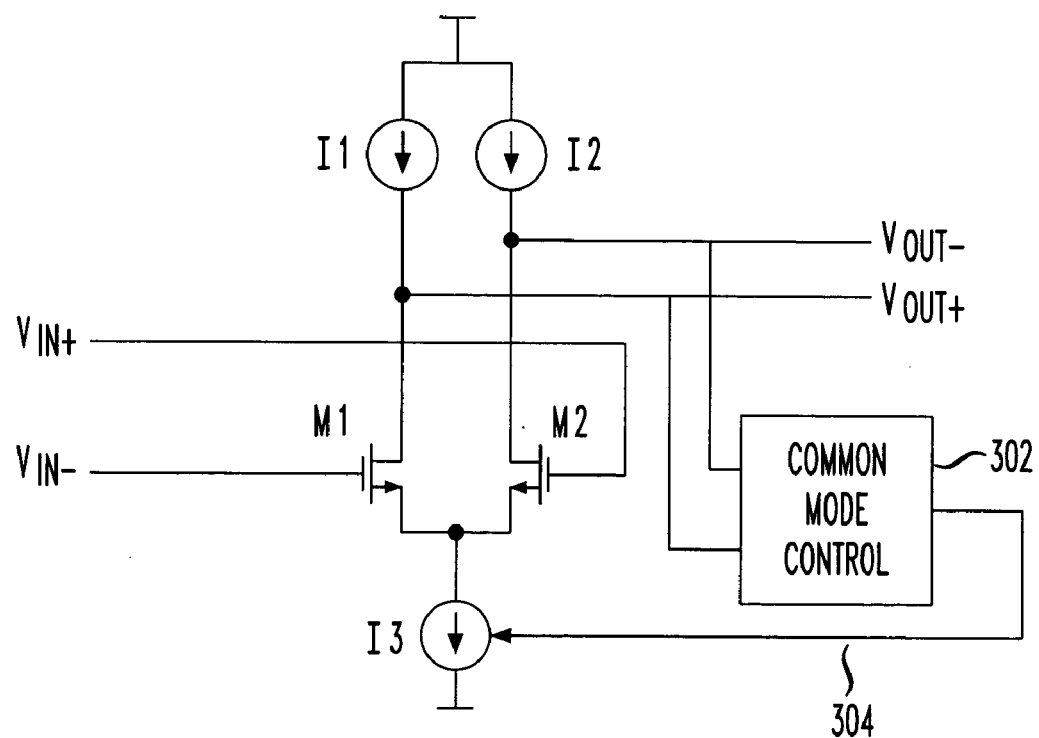
FIG. 3 shows a schematic circuit diagram of the architecture of each transconductor cell of FIG. 2.

This can be demonstrated mathematically. In particular, the transfer function for a biquadratic filter section having an architecture as shown in FIG. 2 is given by Equation (1) as follows:

$$\frac{Vout}{Vin} = \frac{g_{m1}}{g_{m4}} * \frac{\frac{g_{m2}g_{m4}}{C_1 C_2}}{s^2 + s\frac{g_{m3}}{C_1} + \frac{g_{m2}g_{m4}}{C_1 C_2}}, \quad (1)$$

where the cutoff frequency $\omega_0$ and the Q of the biquadratic filter section are given by Equations (2) and (3) as follows:

$$\omega_0 = \sqrt{\frac{g_{m2}g_{m4}}{C_1 C_2}} \quad (2)$$

$$Q = \sqrt{\frac{g_{m2}g_{m4}}{g_{m3}}} \sqrt{\frac{C_1}{C_2}}. \quad (3)$$

Referring again to FIG. 6, when the common-mode voltage signal Vcm is applied to the inputs of the third gm cell of biquadratic filter section 510, the transconductance $g_{m3}$ of that third gm cell goes to zero, which, according to Equation (3) makes the Q of filter section 510 go to infinity. This effectively moves the poles of filter section 510 to the jω axis (as indicated by replacing the $g_{m3}$ term in Equation (1) with 0), which in turn allows filter section 510 to oscillate and, in particular, to oscillate at the cutoff frequency $\omega_0$. Note that, although the transconductance of the third gm cell is set to zero for the oscillation mode, the loading at all nodes of filter section 510 is approximately the same as when the third gm cell is operated in its filter mode.

Referring again to FIG. 5, in addition to biquadratic filter section 510, tuning circuit 408 has components that assist in the generation of tuning control signals 410 of FIG. 4. For example, programmable controller 502 loads timer 504, counter 506, and tuning control block 508 with appropriate address and data information and implements a tuning algorithm. In particular, programmable controller 502 applies oscillate control signal 516 and tuning vector 518 to biquadratic filter section 510 and receives borrow signal 520 from counter 506. Depending on the implementation, tuning vector 518 controls such characteristics as transconductance, capacitance, and source degeneration to adjust the frequency of oscillation of biquadratic filter section 510. Although not shown in FIG. 5, control signals 410 of FIG. 4 are identical to tuning vector 518 or at least are generated based on some or all of the information represented in tuning vector 518.

When dictated by controller 502, tuning control block 508 applies oscillate control signal 516 to biquadratic filter section 510 to control switches 602 in the third gm cell (see FIG. 6) to select the common-mode voltage signal Vcm to cause filter section 510 to oscillate. The output of biquadratic filter section 510 is sliced at comparator 512, whose output is applied to gate 512 along with the output from timer 504 to generate the input to counter 506. Timer 504 is set to a desired measurement period, while counter 506 is preset to the target number of oscillation cycles for the desired filter cutoff frequency $\omega_0$ that should occur during the measurement period. If, at the end of the timer period, a borrow has occurred, then there were more oscillation cycles than desired, and controller 502 adjusts the tuning vector to a lower value. If no borrow occurs, then controller 502 adjusts the tuning vector to a higher value. In this way, programmable controller 502 ensures that biquadratic filter section 510 will oscillate at the desired cutoff frequency $\omega_0$. In addition, Q tuning can be accomplished by adjusting the output conductance of the gm cells within filter section 510 to achieve a desired oscillation amplitude.

In a preferred implementation, tuning vector 518 represents a set of digital control signals that can be stored in flip-flop circuitry within tuning control block 508. As such, the tuning of biquadratic filter section 510 can be implemented intermittently as opposed to the continuous tuning of prior-art filter 100 of FIG. 1. This can reduce the power consumption of filter 400 of the present invention as compared to that of prior-art filter 100. In addition, filters of the present invention can avoid having to implement the reference generator and phase-locked loop of prior-art filter 100.

Because biquadratic filter section 510 of FIG. 5 (preferably) has the same general architecture as each biquadratic filter section 404 in the main signal path of filter 400 of FIG. 4, filter section 510 can be—and preferably is—implemented as a replica that more closely matches the filter sections in the main signal path than can be achieved using oscillator 112 of prior-art filter 100 of FIG. 1. As such, the errors associated with such sources as differences in parasitic capacitances at the transconductor cell output nodes, random component mismatch, and differences in cell loading can be reduced.

Figure 7:
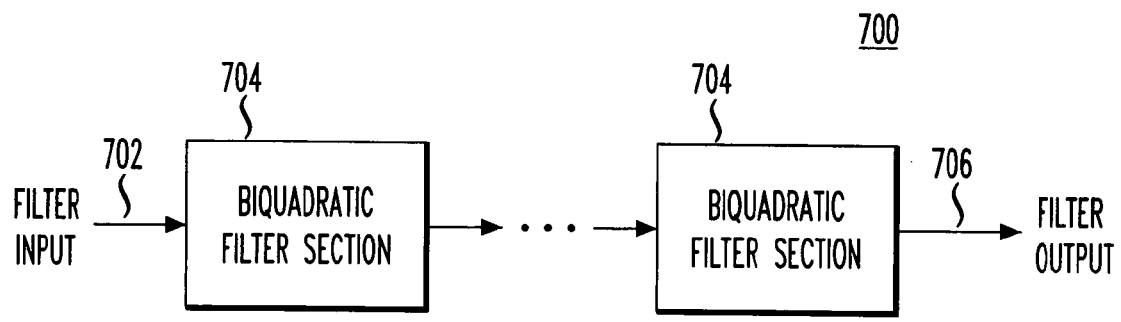
FIG. 7 shows a filter having biquadratic filter sections, according to an alternative embodiment of the present invention.

FIG. 7 shows a filter 700, according to an alternative embodiment of the present invention. As shown in FIG. 7, and like filter 400 of FIG. 4, filter 700 has a main signal path comprising one or more biquadratic filter sections 704, where the main signal path receives an input signal 702 and generates the filtered output signal 706, where the output from each biquadratic filter section provides the input to the next biquadratic filter section along the main signal path. Like filter 400, each section 704 in filter 700 has a biquadratic filter having the same general architecture as that shown in FIG. 2. Unlike filter 400, however, filter 700 does not have a separate tuning circuit outside of the main signal path. Rather, in filter 700, each section 700 is itself an instance of tuning circuit 408 having tuning elements as shown in FIG. 5 and a biquadratic filter section 510, whose third gm cell is shown in FIG. 6.

In this embodiment, each quadratic filter section 704 can tune itself without having to rely on any replica. Moreover, each filter section 704 can be implemented to perform its tuning algorithm independent of each other filter section 704. Since each filter section 704 is able to store its own tuning vector, depending on the particular application, the tuning of different filter sections can be selected to be either simultaneous or staggered in time, whichever is more desirable in terms of minimizing the impact to normal filtering operations.

Exemplary Filters Having Ladder Structures

In the previous section, the present invention was described in the context of filters having one or more biquadratic filter sections in the filter's main signal path. In this section, the present invention is described in the context of filters having a ladder structure.

Figure 8A:
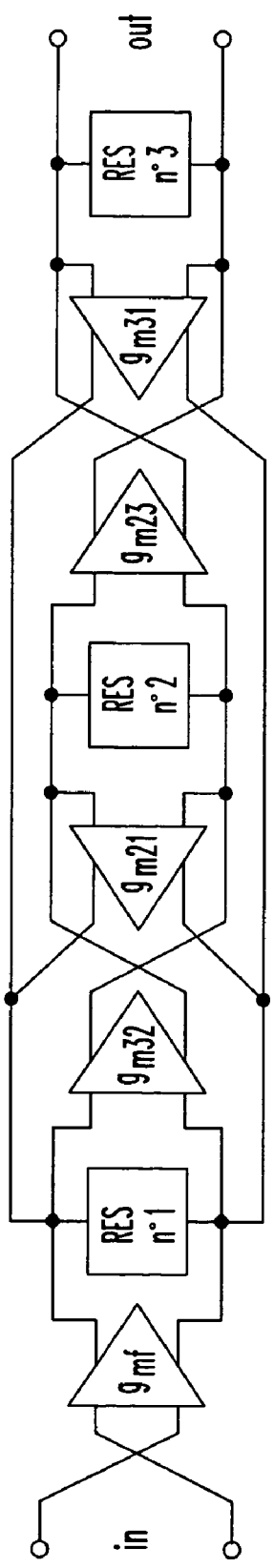
FIG. 8(a) shows a block diagram of a filter having a ladder structure, according to one embodiment of the present invention.
Figure 8B:
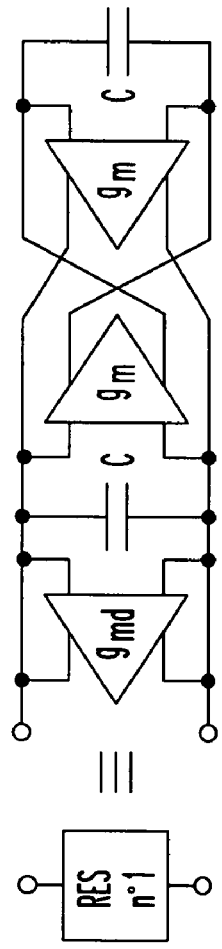
FIG. 8(b) shows a block diagram of a resonator of the filter of FIG. 8(a).

FIG. 8(a) shows a block diagram of a filter 800 having a ladder structure, according to one embodiment of the present invention. FIG. 8(b) shows a block diagram of resonator RES no. 1 of filter 800. According to this embodiment, transconductor cell $g_{md}$ of FIG. 8(b) is implemented using the same gm cell architecture as shown in FIG. 6. Filter 800 can be configured as an oscillator by switching off transconductor cell $g_{md}$ of FIG. 8(b) (i.e., by configuring switches 602 of FIG. 6 such that the common-mode voltage signal Vcm is applied to both gm cell inputs).

In one implementation, filter 800 can be used in place of biquadratic filter section 510 of FIG. 5 to form a ladder tuning circuit that is analogous to biquadratic tuning circuit 408 of FIG. 4. In a configuration analogous to that shown for filter 400 of FIG. 4, this ladder tuning circuit can be used to tune the main signal path of a filter having a ladder structure such as that shown in FIG. 8(a). Alternatively, in a configuration analogous to that shown for filter 700 of FIG. 7, this ladder tuning circuit can be part of the ladder filter's main signal path.

The present invention has been described in the context of filters having biquadratic filter sections and filters having ladder structures. Both of these types of filters are implemented using transconductor cells. The present invention can be extended to apply to other suitable types of filters that are implemented using transconductor cells.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

We claim:

1. Circuitry comprising a filter having one or more filter sections, wherein:
   at least one of the one or more filter sections comprises a plurality of transconductor (gm) cells;
   at least one of the gm cells can be configured to have substantially zero transconductance, such that the at least one filter section will oscillate;
   the at least one gm cell has switch circuitry connected to first and second input nodes of the at least one gm cell;
   the at least one gm cell is adapted to be configured to have non-zero transconductance by selectively applying two different input signals to the first and second input nodes using the switch circuitry; and
   the at least one gm cell is adapted to be configured to have substantially zero transconductance by selectively applying a single input signal to the first and second input nodes using the switch circuitry.

2. The invention of claim 1, wherein the at least one filter section is adapted to oscillate at a cutoff frequency of the filter section.

3. The invention of claim 1, wherein the at least one filter section has an input node adapted to receive an input signal for the at least one filter section, an intermediate node, and an output node adapted to present an output signal for the at least one filter section and further comprises:
  a first gm cell connected between the input node and the intermediate node;
  a first capacitor connected between the intermediate node and a voltage reference;
  a second gm cell connected between the intermediate node and the output node;
  a second capacitor connected between the output node and the voltage reference;
  a third gm cell connected at both ends to the intermediate node; and
  a fourth gm cell connected between the output node and the intermediate node, wherein:
    the at least one gm cell is the third gm cell; and
    the third gm cell comprises a set of switches that enable the third gm cell to be configured to have substantially zero transconductance, such that the at least one filter section will oscillate.

4. The invention of claim 3, wherein the voltage reference is ground.

5. The invention of claim 1, wherein:
the at least one filter section is in a main signal path of the filter; and
the at least one filter section is adapted to be configured to oscillate in order to tune the at least one filter section.

6. The invention of claim 5, wherein each filter section in the main signal path of the filter can be configured to oscillate in order to tune each filter section.

7. The invention of claim 1, wherein:
the one or more filter sections comprise one or more main-path filter sections and a non-main-path filter section;
the filter comprises a main signal path having the one or more main-path filter sections;
the at least one filter section is the non-main-path filter section, which is not part of the main signal path;
the non-main-path filter section is a replica of at least one main-path filter section in the main signal path; and
the non-main-path filter section is adapted to be configured to oscillate in order to tune the at least one main-path filter section in the main signal path.

8. The invention of claim 1, wherein:
the at least one filter section comprises tuning circuitry adapted to tune the at least one filter section; and
the tuning circuitry is adapted to store tuning control information for the at least one filter section such that the at least one filter section can be tuned intermittently.

9. The invention of claim 8, wherein information based on the tuning control information of the at least one filter section is used to tune one or more other filter sections in the filter.

10. The invention of claim 1, wherein the at least one filter section is adapted to oscillate without relying on phase-locked loop circuitry.

11. The invention of claim 1, wherein the one or more filter sections are biquadratic filter sections.

12. The invention of claim 1, wherein the one or more filter sections are connected to form a ladder structure.

13. The invention of claim 1, wherein:
the two different input signals are a differential signal pair; and
the single input signal is a common-mode signal corresponding to the differential signal pair.

14. A method for operating a filter having one or more filter sections, wherein:
at least one of the one or more filter sections comprises a plurality of transconductor (gm) cells;
the method comprising:
  applying power to the filter; and
  configuring at least one of the gm cells to have substantially zero transconductance, such that the at least one filter section will oscillate;
the at least one gm cell has switch circuitry connected to first and second input nodes of the at least one gm cell;
the at least one gm cell is adapted to be configured to have non-zero transconductance by selectively applying two different input signals to the first and second input nodes using the switch circuitry; and
the at least one gm cell is configured to have substantially zero transconductance by selectively applying a single input signal to the first and second input nodes using the switch circuitry.

15. The invention of claim 14, wherein the at least one filter section oscillates at a cutoff frequency of the filter section.

16. The invention of claim 14, wherein:
the at least one filter section has an input node that receives an input signal for the at least one filter section, an intermediate node, and an output node that presents an output signal for the at least one filter section;
the at least one filter section further comprises:
  a first gm cell connected between the input node and the intermediate node;
  a first capacitor connected between the intermediate node and a voltage reference;
  a second gm cell connected between the intermediate node and the output node;
  a second capacitor connected between the output node and the voltage reference;
  a third gm cell connected at both ends to the intermediate node; and
  a fourth gm cell connected between the output node and the intermediate node, wherein:
    the at least one gm cell is the third gm cell; and
    the third gm cell comprises a set of switches that enable the third gm cell to be configured to have substantially zero transconductance, such that the at least one filter section will oscillate.

17. The invention of claim 14, wherein:
the at least one filter section is in a main signal path of the filter; and
the at least one filter section is configured to oscillate in order to tune the at least one filter section.

18. The invention of claim 14, wherein:
the one or more filter sections comprise one or more main-path filter sections and a non-main-path filter section;
the filter comprises a main signal path having the one or more main-path filter sections;
the at least one filter section is the non-main-path filter section, which is not part of the main signal path;
the non-main-path filter section is a replica of at least one main-path filter section in the main signal path; and
the non-main-path filter section is configured to oscillate in order to tune the at least one main-path filter section in the main signal path.

19. The invention of claim 14, wherein:
the at least one filter section comprises tuning circuitry that tunes the at least one filter section; and the tuning circuitry stores tuning control information for the at least one filter section such that the at least one filter section can be tuned intermittently.

20. The invention of claim 19, wherein information about the tuning of the at least one filter section is used to tune one or more other filter sections in the filter.

21. The invention of claim 14, wherein the at least one filter section oscillates without relying on phase-locked loop circuitry.

22. The invention of claim 14, wherein:
the two different input signals are a differential signal pair; and
the single input signal is a common-mode signal corresponding to the differential signal pair.

23. Circuitry comprising a filter having one or more filter sections, wherein:
at least one of the one or more filter sections comprises a plurality of transconductor (gm) cells;
at least one of the gm cells can be configured to have substantially zero transconductance, such that the at least one filter section will oscillate;
the at least one filter section has an input node adapted to receive an input signal for the at least one filter section, an intermediate node, and an output node adapted to present an output signal for the at least one filter section and further comprises:
a first gm cell connected between the input node and the intermediate node;
a first capacitor connected between the intermediate node and a voltage reference;
a second gm cell connected between the intermediate node and the output node;
a second capacitor connected between the output node and the voltage reference;
a third gm cell connected at both ends to the intermediate node; and
a fourth gm cell connected between the output node and the intermediate node, wherein:
the at least one gm cell is the third gm cell; and
the third gm cell comprises a set of switches that enable the third gm cell to be configured to have substantially zero transconductance, such that the at least one filter section will oscillate.

24. The invention of claim 23, wherein the voltage reference is ground.

25. A method for operating a filter having one or more filter sections, wherein:
at least one of the one or more filter sections comprises a plurality of transconductor (gm) cells;
the method comprising:
applying power to the filter; and
configuring at least one of the gm cells to have substantially zero transconductance, such that the at least one filter section will oscillate;
the at least one filter section has an input node that receives an input signal for the at least one filter section, an intermediate node, and an output node that presents an output signal for the at least one filter section; and
the at least one filter section further comprises:
a first gm cell connected between the input node and the intermediate node;
a first capacitor connected between the intermediate node and a voltage reference;
a second gm cell connected between the intermediate node and the output node;
a second capacitor connected between the output node and the voltage reference;
a third gm cell connected at both ends to the intermediate node; and
a fourth gm cell connected between the output node and the intermediate node, wherein:
the at least one gm cell is the third gm cell; and
the third gm cell comprises a set of switches that enable the third gm cell to be configured to have substantially zero transconductance, such that the at least one filter section will oscillate.

26. A method for operating a filter having one or more filter sections, wherein:
at least one of the one or more filter sections comprises a plurality of transconductor (gm) cells;
the method comprising:
applying power to the filter; and
configuring at least one of the gm cells to have substantially zero transconductance, such that the at least one filter section will oscillate;
the at least one filter section comprises tuning circuitry that tunes the at least one filter section; and
the tuning circuitry stores tuning control information for the at least one filter section such that the at least one filter section can be tuned intermittently.

27. The invention of claim 26, wherein information about the tuning of the at least one filter section is used to tune one or more other filter sections in the filter.

* * * * *